United States Patent
Ragonese et al.

(10) Patent No.: US 10,298,408 B2
(45) Date of Patent: May 21, 2019

(54) METHOD OF TRANSMITTING POWER AND DATA ACROSS A GALVANIC ISOLATION BARRIER, CORRESPONDING SYSTEM AND APPARATUS

(71) Applicant: STMicroelectronics S.r.l., Agrate Brianza (IT)

(72) Inventors: Egidio Ragonese, Aci Catena (IT); Nunzio Greco, Bronte (IT); Giuseppe Palmisano, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 483 days.

(21) Appl. No.: 15/138,702

(22) Filed: Apr. 26, 2016

(65) Prior Publication Data
US 2017/0070354 A1   Mar. 9, 2017

(30) Foreign Application Priority Data
Sep. 9, 2015   (IT) .......................... 102015000050091

(51) Int. Cl.
| | |
|---|---|
| H04L 12/10 | (2006.01) |
| H02J 50/10 | (2016.01) |
| H03K 17/691 | (2006.01) |
| H03B 5/12 | (2006.01) |
| H04B 3/54 | (2006.01) |

(52) U.S. Cl.
CPC .............. *H04L 12/10* (2013.01); *H02J 50/10* (2016.02); *H03B 5/1228* (2013.01); *H03K 17/691* (2013.01); *H04B 3/54* (2013.01)

(58) Field of Classification Search
CPC ..................................... H04L 12/10
USPC .......................................................... 329/329
See application file for complete search history.

(56) References Cited

U.S. PATENT DOCUMENTS

| | | | |
|---|---|---|---|
| 5,396,538 A * | 3/1995 | Hong | H02J 7/025 |
| | | | 455/573 |
| 6,466,126 B2 | 10/2002 | Collins et al. | |
| 7,489,526 B2 | 2/2009 | Chen et al. | |
| 7,701,732 B2 | 4/2010 | Ranstad | |
| 7,706,154 B2 | 4/2010 | Chen et al. | |
| 7,737,871 B2 | 6/2010 | Leung et al. | |
| 7,983,059 B2 | 7/2011 | Chen | |

(Continued)

FOREIGN PATENT DOCUMENTS

WO   WO-2005122423 A2   12/2005

OTHER PUBLICATIONS

Chen, Baoxing: "iCoupler(R) Products with isoPower(TM) Technology: Signal and Power Transfer Across Isolation Barrier Using Microtransformers," www.analog.com, 2006 (4 pages).

(Continued)

*Primary Examiner* — Joseph Chang
(74) *Attorney, Agent, or Firm* — Crowe & Dunlevy

(57) ABSTRACT

Power and data are transmitted via a transformer including primary side and secondary side. A primary side signal is generated by coupling a first oscillator signal modulated with a data signal with a second oscillator signal that is selectively switched on and off. At the secondary side a secondary signal is generated. A demodulator demodulates the secondary signal to recover the data signal. A rectifier processes the secondary signal to recover a power supply signal controlled by switching on and off the second oscillator.

14 Claims, 5 Drawing Sheets

(56) References Cited

U.S. PATENT DOCUMENTS

| | | | |
|---|---|---|---|
| 8,084,894 | B2 | 12/2011 | Chen |
| 8,364,195 | B2 | 1/2013 | Spina et al. |
| 8,610,312 | B2 | 12/2013 | Kikuchi |
| 8,618,630 | B2 | 12/2013 | Kaeriyama |
| 8,674,486 | B2 | 3/2014 | Haigh et al. |
| 8,680,690 | B1 | 3/2014 | Steeneken et al. |
| 8,861,229 | B2 | 10/2014 | Alfano et al. |
| 8,912,906 | B2 | 12/2014 | Taniguchi et al. |
| 9,866,283 | B2 | 1/2018 | Subramonian et al. |
| 2003/0063478 | A1* | 4/2003 | Beranger ............... H04B 3/54 363/21.07 |
| 2004/0189271 | A1 | 9/2004 | Hansson et al. |
| 2004/0210349 | A1 | 10/2004 | Lenz et al. |
| 2004/0217749 | A1 | 11/2004 | Orr et al. |
| 2004/0232971 | A1* | 11/2004 | Kawasaki ............ H03K 17/063 327/427 |
| 2007/0121832 | A1 | 5/2007 | Ghoshal |
| 2008/0181316 | A1 | 7/2008 | Crawley et al. |
| 2008/0192509 | A1 | 8/2008 | Dhuyvetter et al. |
| 2008/0231211 | A1 | 9/2008 | Baarman et al. |
| 2008/0267212 | A1 | 10/2008 | Crawley et al. |
| 2009/0168462 | A1 | 7/2009 | Schopfer et al. |
| 2009/0327783 | A1 | 12/2009 | Doss |
| 2010/0052630 | A1 | 3/2010 | Chen |
| 2012/0099345 | A1 | 4/2012 | Zhao et al. |
| 2012/0256290 | A1 | 10/2012 | Renna et al. |
| 2013/0188399 | A1 | 7/2013 | Tang et al. |
| 2014/0085951 | A1 | 3/2014 | Kaeriyama et al. |
| 2014/0253225 | A1 | 9/2014 | Lee et al. |
| 2014/0268917 | A1 | 9/2014 | Ma et al. |
| 2014/0292419 | A1 | 10/2014 | Ragonese et al. |
| 2014/0313784 | A1 | 10/2014 | Strzalkowski |
| 2015/0123749 | A1 | 5/2015 | Li et al. |
| 2015/0180528 | A1 | 6/2015 | Ragonese et al. |
| 2015/0326127 | A1 | 11/2015 | Peng et al. |
| 2015/0364249 | A1 | 12/2015 | Palumbo et al. |
| 2016/0080181 | A1 | 3/2016 | Yun et al. |
| 2016/0241211 | A1 | 8/2016 | Hassan et al. |

OTHER PUBLICATIONS

Wayne, Scott: "iCoupler(R) Digital Isolators Protect RS-232,RS-485, and CAN Buses in Industrial, Instrumentation, and Computer Applications," www.analog.com, Analog Dialogue 39-10, Oct. 2005, (4 pages).

IT Search Report and Written Opinion for IT 102015000050091 dated Apr. 27, 2016 (8 pages).

Chen Baoxing, et al: "Isolated Half-Bridge Gate Driver with Integrated High-Side Supply," Power Electronics Specialists Conference, 2008, PESC 2008, IEEE, Piscataway, NJ, US, Jun. 15, 2008, pp. 3615-3618, XP031300519.

"Techniken Zur Galvanischen Trennung von Schaltungen Und Deren Praktische Umsetzung," Technology Day, Nürnberg 18. Jun. 2009, Texas Instruments Inc. (54 pages).

"Surging Across the Barrier: Digital Isolators Set the Standard for Reinforced Insulation," Analog Devices, Inc., Tech. Article, 2012, MS-2341 (5 pages).

Cantrell: "Reinforced Isolation in Data Couplers," Analog Devices, Inc., Tech. Article, 2011, MS-2242 (4 pages).

Chen: "Fully Integrated Isolated DC-DC Converter Using Micro Transformers," Proc. IEEE Applied Power Electronics Conference and Exposition, (APEC), pp. 335-338, Feb. 2008.

Chen: "Isolated Half-Bridge Gate Driver With Integrated High-Side Supply," Proc. IEEE Power Electronics Specialists Conf. (PESC) pp. 3615-3618, Jun. 2008.

Chen: "Microtransformer Isolation Benefits Digital Control," Power Electronics Technology, pp. 20 25, Oct. 2008.

Chen: "iCoupler® Products with isoPower™ Technology: Signal and Power Transfer Across Isolation Barrier Using Microtransformers," Technical Article, Analog Devices, USA, http://www.analog.com/static/imported_files/overviews/isoPower.pdf (4 pages) Apr. 2006.

Greco et al: "A Galvanically Isolated DC-DC Converter Based on Current-Reuse Hybrid-Coupled Oscillators," IEEE Trans. Circuits Syst. II, early access Mar. 2016 (5 pages).

Kamath et al: "High-Voltage Reinforced Isolation: Definitions and Test Methodologies," Texas Instruments, Tech. Article, Nov. 2014, SLYY063 (10 pages).

Lombardo et al: "A Fully-Integrated Half-Duplex Data/Power Transfer System With Up to 40Mbps Data Rate, 23mW Output Power and On-Chip 5kV Galvanic Isolation," IEEE International Solid-State Circuits Conference (ISSCC), San Francisco, USA, Feb. 2016, pp. 300-301.

Marwat: "Digital Isolators Compliance to IEC 61010-1 Edition 3.0 Safety Requirements," Texas Instruments, White Paper, 2014, SLYY055 (5 pages).

Spina, et al: "Current-Reuse Transformer Coupled Oscillators With Output Power Combining for Galvanically Isolated Power Transfer Systems," IEEE Transaction on Circuits and Systems I, vol. 62, pp. 2940-2948, Dec. 2015.

* cited by examiner

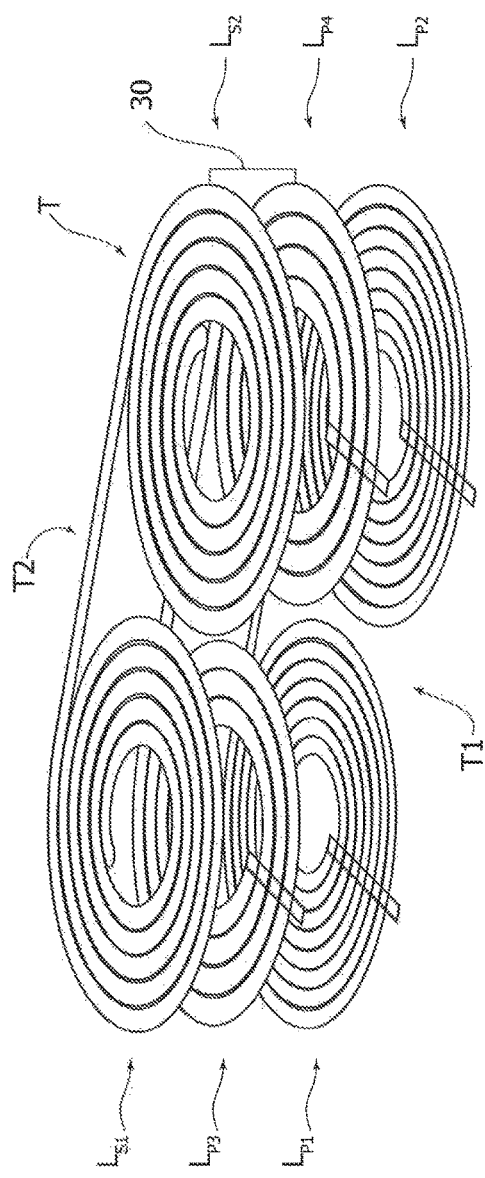
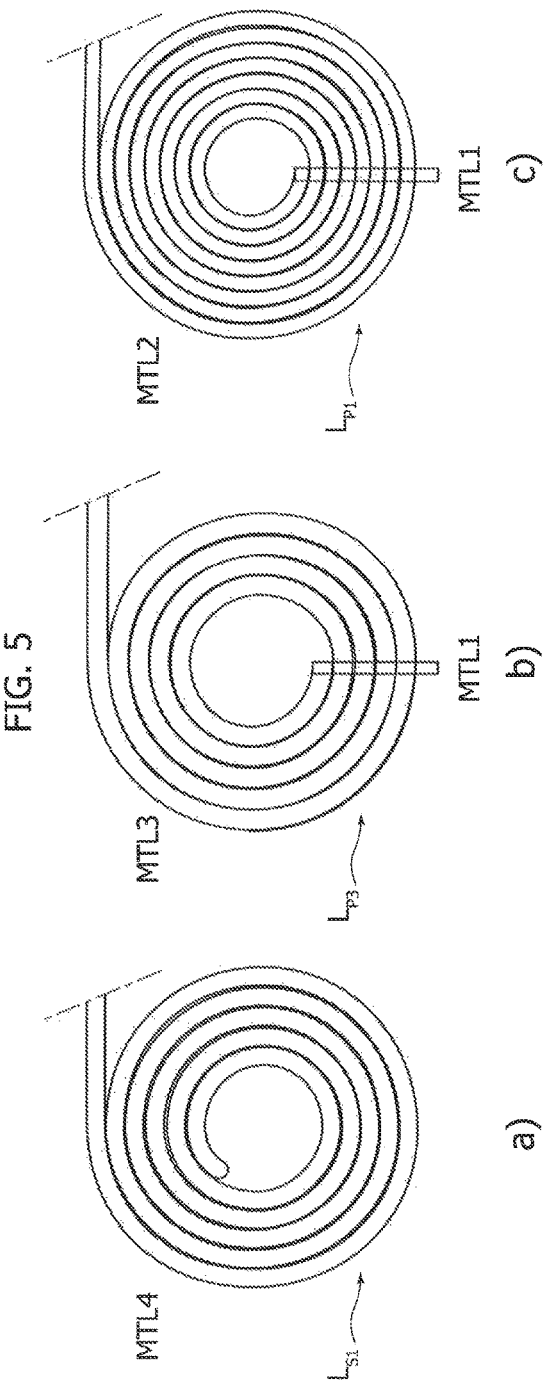
FIG. 4
FIG. 5

METHOD OF TRANSMITTING POWER AND DATA ACROSS A GALVANIC ISOLATION BARRIER, CORRESPONDING SYSTEM AND APPARATUS

PRIORITY CLAIM

This application claims priority from Italian Application for Patent No. 102015000050091 filed Sep. 9, 2015, the disclosure of which is incorporated by reference.

TECHNICAL FIELD

The description relates to galvanically isolated transformer-based systems. One or more embodiments may permit uni-directional and bi-directional (e.g. half-duplex) data communication and variable wireless power transfer over an isolated transformer-based channel.

BACKGROUND

Transformer-based systems may be used to provide data communication and/or power transfer across a galvanic isolation barrier. Exemplary fields of application of these systems are the industrial field (e.g., gate drivers), the medical field (e.g., implantable devices), and more generally, sensors, lighting and other areas where galvanic isolation may be helpful.

The need is therefore felt for improved arrangements for transmitting power and data via a transformer.

Several examples of data communication in galvanically isolated systems are disclosed e.g. in: a) S. Wayne, "iCoupler® Digital Isolators Protect RS-232, RS-485, and CAN Buses in Industrial, Instrumentation, and Computer Applications", Analog Dialogue 39-10, October (2005) (incorporated by reference); b) U.S. Pat. No. 8,364,195 and c) ISO8200B—"Galvanic isolated octal high-side smart power solid state relay" STMicroelectronics Datasheet, April 2014 (incorporated by reference). For instance, multiple transformers may be used to implement multiple isolated channels for bidirectional communication and isolated power links as disclosed e.g. in: d) Baoxing Chen—"iCoupler® Products with isoPower™ Technology: Signal and Power Transfer Across Isolation Barrier Using Microtransformers", 2006 available at http://www.analog.com/isoPower (incorporated by reference), e) U.S. Pat. Nos. 7,983,059, 7,489,526 and 7,706,154 (incorporated by reference), and f) United States Patent Application Publication No. 2012/0256290 (incorporated by reference). An arrangement as described in United States Patent Application Publication No. 2015/0180528 (incorporated by reference) may exploit a same isolation transformer to implement power transfer and bidirectional/half-duplex data communication, possibly by resorting to an oscillator topology as disclosed in United States Patent Application Publication No. 2014/0292419 (incorporated by reference).

In such a system, data communication may be available (only) when power is being transferred, which militates against the possibility of controlling the output power level by on-off switching e.g. with a periodic PWM control, as desirable in various applications (e.g., gate drivers) or when a variable power level may facilitate covering a wide range of products with a same device (e.g., in an isolated interface).

SUMMARY

One or more embodiments may relate to a corresponding system and apparatus including such a system. Industrial apparatus such as e.g., gate drivers, medical apparatus (e.g., implantable devices), and more generally, sensors, lighting and other devices including a galvanic isolation barrier are exemplary of such apparatus.

The claims are an integral part of the disclosure of one or more exemplary embodiments as provided herein.

One or more embodiments may offer one or more of the following advantages:

- uni-directional and bi-directional (e.g. half-duplex) isolated data communication and power transfer may exploit a same isolation transformer with consequent area saving with respect to traditional solutions where data and power channels are separated;
- data communication may be made available together with variable power transfer, which may be an asset e.g. in gate driver application; and
- one or more embodiments may be implemented as fully-isolated half-bridge gate drivers.

BRIEF DESCRIPTION OF THE DRAWINGS

One or more embodiments will now be described, by way of example only, with reference to the enclosed figures, wherein:

FIGS. 4 and 5 are exemplary of transformer windings which may be used in embodiments;

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
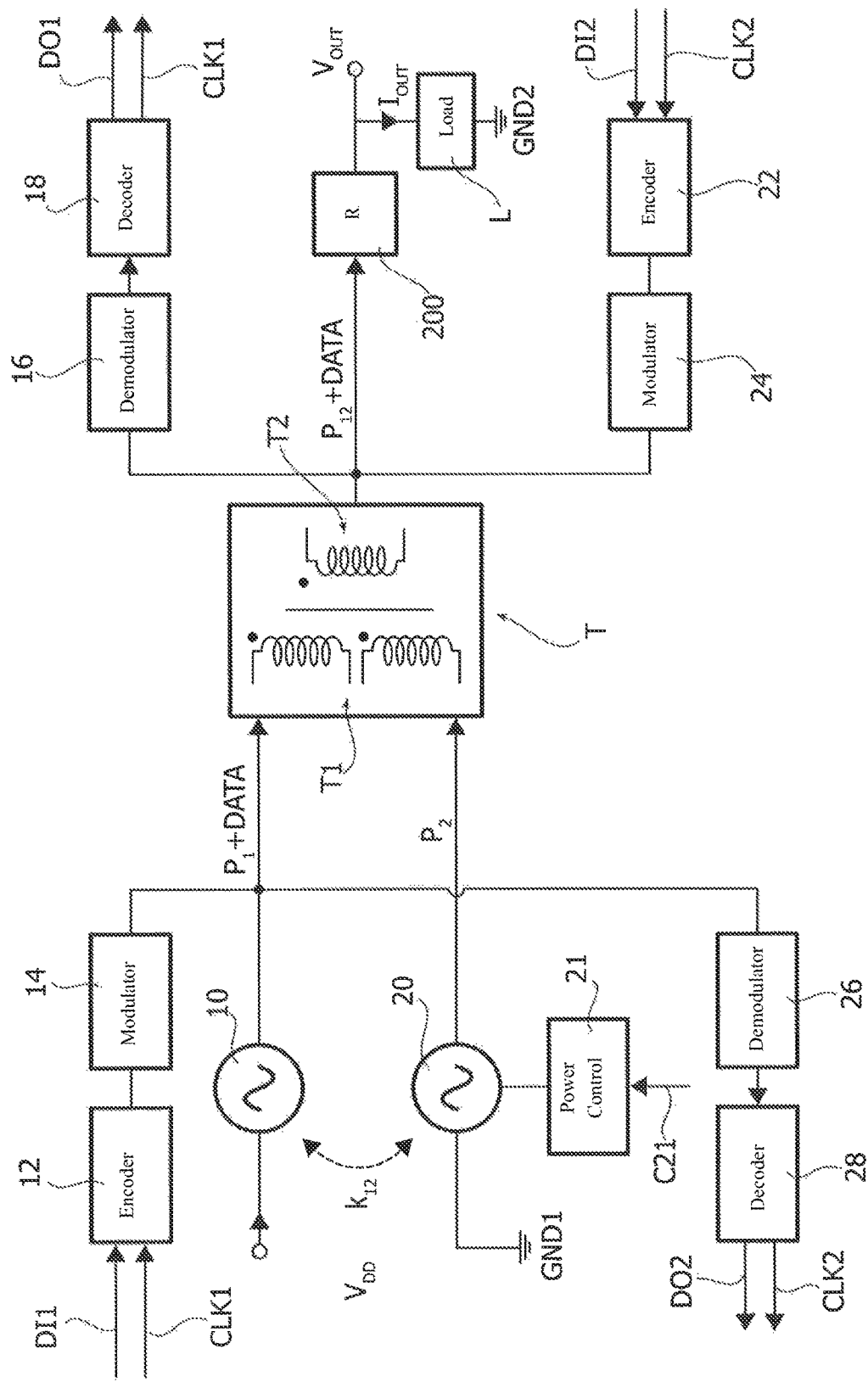
FIG. 1 is a block diagram exemplary of embodiments.

FIG. 1 is exemplary of one more embodiments where drawbacks related e.g. to the difficulty of changing dynamically the amount of power transferred without interrupting data communication may be overcome.

FIG. 1 is exemplary of a galvanically-isolated system built around a (single) isolation transformer T including primary side T1 and secondary side T2 windings. According to the basic principle of transformer operation, a (time variable, e.g. ac) signal at the primary side T1 will generate a corresponding (time variable, e.g. ac) signal at secondary side T2 of the transformer T.

One or more embodiments may involve producing a primary side signal at the primary side T1 of the transformer T by coupling (e.g. with a coupling factor $k_{12}$, as better detailed in the following) a signal from a first oscillator 10 and a signal from a second oscillator 20.

In FIG. 1, the signal from the first oscillator 10 is designated $P_1$+DATA: in one or more embodiments, the signal from the first oscillator 10 may result from modulating a (e.g. sinusoidal) continuous signal $P_1$ with a data signal DATA for transmission to the secondary side T2 of the transformer T as produced e.g. starting from a clocked (CLK1) input bitstream DI1 via an encoder 12 and a modulator 14.

In one or more embodiments, the signal from the second oscillator 20, designated $P_2$ may be a (e.g. sinusoidal) signal $P_2$ which may be selectively switched on and off (e.g. put to a primary side ground GND1) via a power control module 21. In one or more embodiments, the module 21 may be operated—in a manner known per se e.g. according to a PWM modulation pattern under the control of an external input C21—in order to control power supply transmission to the secondary side T2 of the transformer T.

One or more embodiments may provide for applying to a secondary signal $P_{12}$+DATA thus generated at the secondary side T2 of the transformer T:
- demodulation e.g. via a demodulator 16 followed by a decoder 18 to recover as DO1 at the secondary side T2 of the transformer T the data signal DATA (DI1) modulating the signal of the first oscillator 10; and
- rectification e.g. at a rectifier 200 to recover at the secondary side T2 of the transformer T a power supply signal $V_{OUT}$, $I_{OUT}$ to be possibly applied to a load L referred to a secondary side ground GND 2, with the power associated to that power supply signal controlled by switching on and off (e.g. PWM) the second oscillator 20 under the control of the module 21.

In one or more embodiments, a power transfer link may thus be implemented by means of two coupled (e.g. RF) oscillators 10, 20, an isolation transformer T and a rectifier (R) 200, with the power signals (e.g. $P_1$ and $P_2$) generated by the two RF oscillators 10, 20 combined through the isolation transformer T in the output (ac) power (i.e., P12) that is converted again to dc power by the rectifier 200.

In one or more embodiments, frequency synchronization of the two oscillators 10, 20 may obtained by a good coupling (i.e., inductive, capacitive or mixed) between the two oscillators 10, 20.

In one or more embodiments, the output power (as applicable e.g. on the load L, which per se may not be a part of embodiments) may be controlled by switching-off periodically e.g. with a PWM control (module 21) one of the two RF oscillators (e.g. oscillator 20), while the other one (e.g. oscillator 10) may be constantly active ("on").

FIG. 1 is exemplary of the possibility, in one or more embodiments, of implementing bi-directional (e.g. time division, half-duplex) data communication between the primary side T1 and the secondary side T2 of the transformer.

One or more embodiments may in fact provide for coupling to the secondary side T2 of the transformer T (e.g. at 200) a further data signal for transmission to the primary side T1 of the transformer T as produced e.g. starting from a further clocked (CLK2) input bitstream DI2 via an encoder 22 and a modulator 24 at the secondary side T2 of the transformer T.

One or more embodiments may then correspondingly provide for applying demodulation e.g. via a demodulator 26 followed by a decoder 28 at the primary side T1 in order to recover as DO2 at the primary side T1 of the transformer T (e.g. at the first oscillator 10) the further data signal DI2 coupled e.g. to the rectifier 200.

In one or more embodiments, data transfer towards the secondary side T2, that is towards the load L, may be obtained by modulating (e.g. at 12, 14) the power signal of the RF oscillator which is always on (e.g. oscillator 10) and demodulating (e.g. at 16, 18) the signal at the secondary side T2 of the isolation transformer T.

In one or more embodiments, data transfer in the opposite direction may be implemented thanks to a backscattering-like effect, e.g. by coupling data modulation to the secondary side T2 (e.g. at 22, 24 at the load L/rectifier 200) and then demodulating (e.g. at 26, 28) the signal thus produced at the primary side T1, e.g. at the oscillator 10 that is always on.

Figure 2:
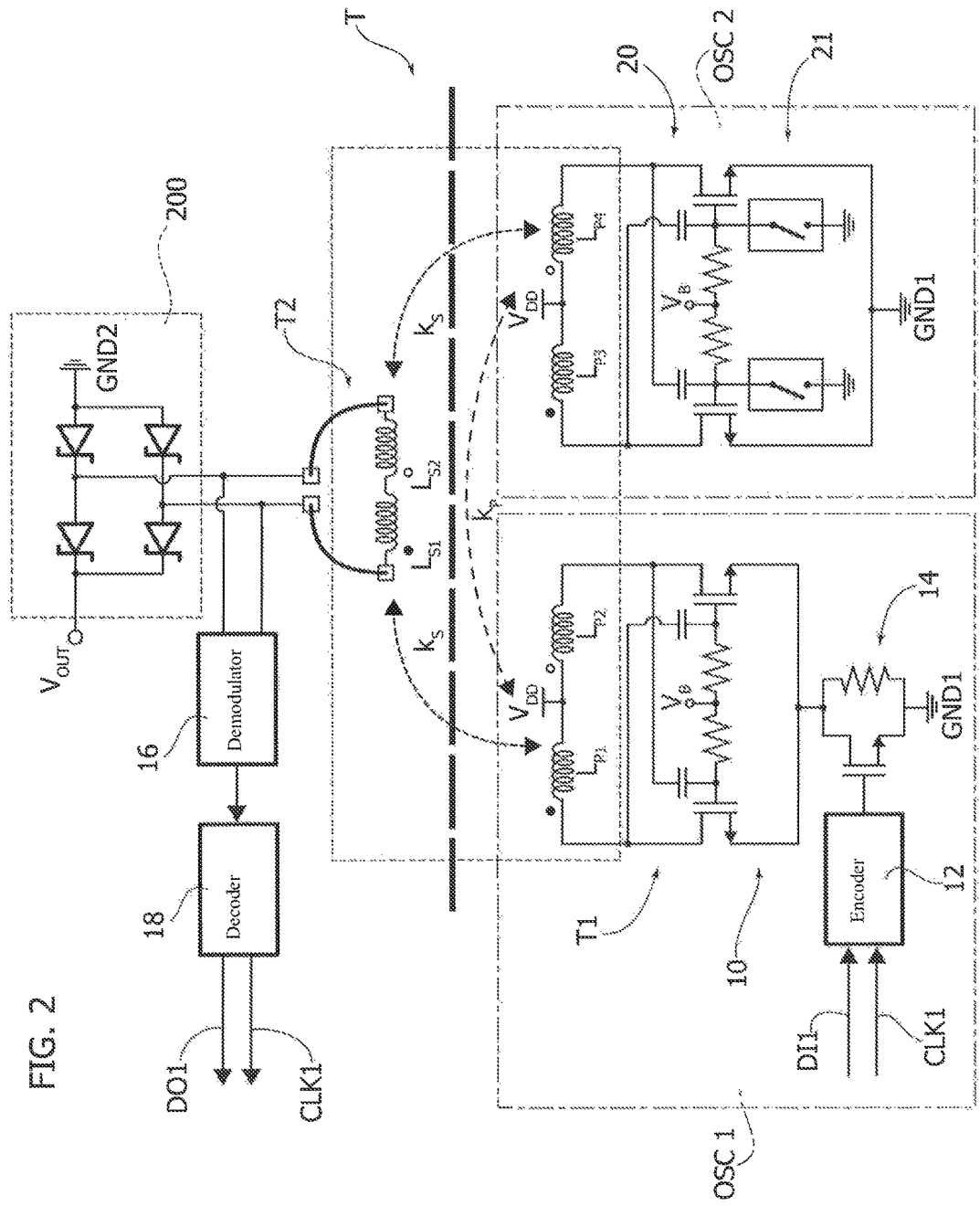
FIGS. 2 and 3 are circuit diagrams exemplary of various embodiments.
Figure 3:
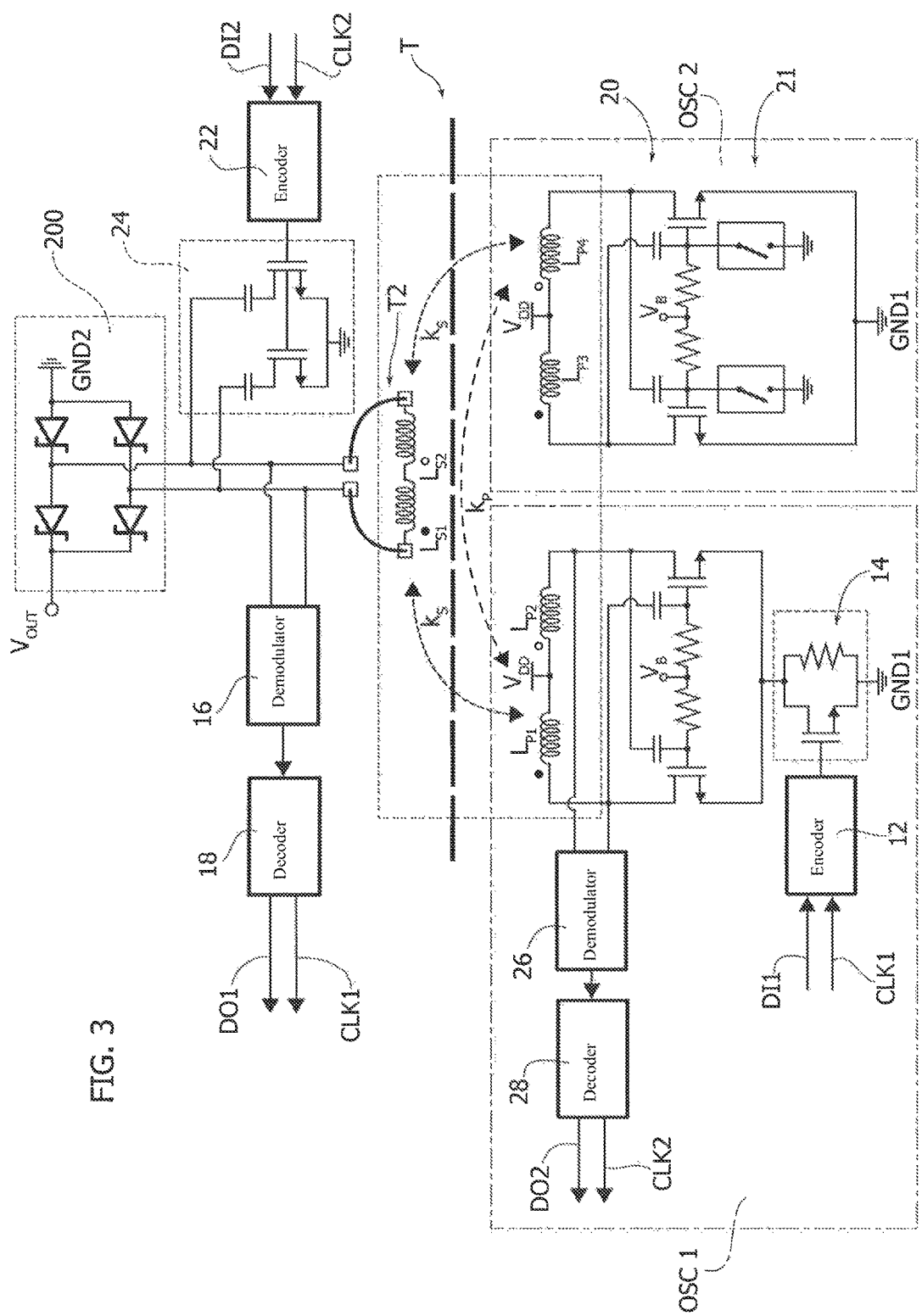

FIGS. 2 and 3 are exemplary of possible transistor-level implementations of:
- a system with uni-directional data communication and variable power transfer (FIG. 2), and
- a system with bi-directional (half-duplex) data communication and variable power transfer (FIG. 3).

In FIGS. 2 and 3 parts or elements corresponding to parts or elements already discussed in connection with FIG. 1 are indicated with the same reference symbols; for the sake of brevity a corresponding description will not be repeated here.

In one or more embodiments as exemplified in FIGS. 2 and 3, power transfer may take advantage of two coupled n-MOS oscillators 10, 20 (a similar implementation may rely on two coupled p-MOS oscillators).

A system according to one or more embodiments may be able to deliver a variable output power level, while preserving the overall efficiency, e.g. by making the power derived from the power transfer oscillator (e.g. oscillator 20) higher than the power derived from the power/data transfer oscillator (e.g. oscillator 10), that is by adjusting the power of the signal of the second oscillator 20 to be higher than the power of the signal of the first oscillator 10.

In one or more embodiments, the power/data transfer oscillator 10 may be adjusted to deliver low power to reduce the effect of data communication on the overall system power efficiency.

For instance, data communication may be obtained by modulating the amplitude of the RF oscillation signal at the primary windings ($L_{P1}$-$L_{P2}$) driven by the oscillator 10 by means of a judicious reduction in the voltage headroom.

In one or more embodiments, this may be obtained by coupling the modulator block 14 to the ground side of the power/data oscillator 10, that is by coupling the modulator 14 to the (first) oscillator 10 at the primary side T1 of the transformer T by setting the modulator 14 between the oscillator 10 and ground GND1.

The amplitude-modulated oscillation signal applied via the oscillator 10 to the primary windings $L_{P1}$-$L_{P2}$ may be transferred (e.g. with a coupling factor $k_s$) to the secondary windings (e.g. $L_{S1}$ and $L_{S2}$) to be then provided to the demodulator block 16.

Similarly the on-off (e.g. PWM) switched signal $P_2$ applied via the oscillator 20 to the primary windings $L_{P3}$-$L_{P4}$ may be transferred (e.g. again with a coupling factor $k_s$) to the secondary windings (e.g. $L_{S1}$ and $L_{S2}$) to be then provided to the rectifier block 200.

Proper operation of a circuit as exemplified in FIGS. 2 and 3 may be facilitated by a good design of the isolation transformer T together with a judicious choice of the oscillator power levels and modulation index.

FIGS. 4 and 5 are representative of an integrated stacked transformer T which may be used in one or more embodiments, including:
- a first pair of primary windings $L_{P1}$-$L_{P2}$ to be driven by the oscillator 10,
- a second pair of primary windings $L_{P3}$-$L_{P4}$ to be driven by the oscillator 20, and
- a pair of secondary windings $L_{S1}$-$L_{S2}$.

Reference numeral 30 in FIG. 4 denotes dielectric layers for isolation.

In one or more embodiments, coupling the signal from the first oscillator 10 and the signal from the second oscillator 20 may thus include feeding the first oscillator signal and the second oscillator signal to at least one respective winding ($L_{P1}$-$L_{P2}$; $L_{P3}$-$L_{P4}$) of a multifilar-wound winding at the primary side T1 of the transformer T, thus providing a coupling factor $k_P$ corresponding to $k_{12}$ in FIG. 1. In this configuration, the windings $L_{P3}$-$L_{P4}$ are stacked to the windings $L_{P1}$-$L_{P2}$.

FIG. 5 represents a possible implementation of such an isolation transformer by using a back-end of four metal layers (i.e., MTL1 to MTL4).

In one or more embodiments, windings as exemplified in FIGS. 4 and 5 may permit to obtain a good magnetic coupling and attain both efficient power transfer and robust frequency synchronization (e.g. with an inductance ratio adapted to prevent startup issues) while permitting a low modulation index to be used.

The foregoing also applies to an arrangement as exemplified in FIG. 3, which may rely on impedance modulation at the secondary side coils $L_{S1}$-$L_{S2}$ to permit complete bidirectional/half-duplex data communication with variable isolated power.

Figure 6:
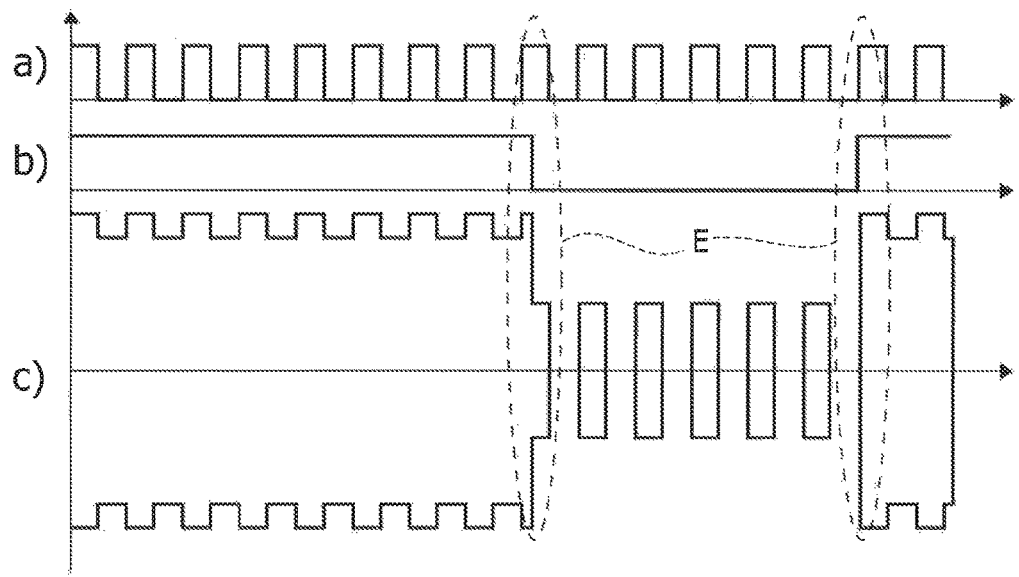
FIG. 6, including three portions designated a), b) and c), is exemplary of the possible time behavior of signals in embodiments.

FIG. 6 is exemplary of possible time behaviors of:
- a DATA signal used to modulate the signal $P_1$ from the first oscillator 10—part a);
- a PWM signal used to switch on and off the signal $P_2$ from the second oscillator 12—part b); and
- the resulting signal $P_1$+DATA+$P_2$ applied to the primary side T1 of the transformer T, which is mirrored at the secondary side T2 of the transformer T by a corresponding signal adapted e.g. to be demodulated at 16 and rectified at 200—part c).

Such a power control strategy may result in transition regions E where the signal level may change significantly, with the risk of possibly producing data demodulation errors.

In one or more embodiments, this risk may be reduced by synchronizing data (e.g. DI1) and PWM control signals (module 21), e.g. with a (small) mutual delay applied to mitigate the effects of transients.

The foregoing may also apply to the data (e.g. DI2) transmitted from the secondary side T2 to the primary side T1 of the transformer T, with modulation of the signal from the first oscillator 10 by the data signal DATA (DI1) discontinued as the data signal DI2 is applied e.g. superposed to rectification at 200 at the secondary side T2 to be then demodulated at the primary side T1.

Figure 7:
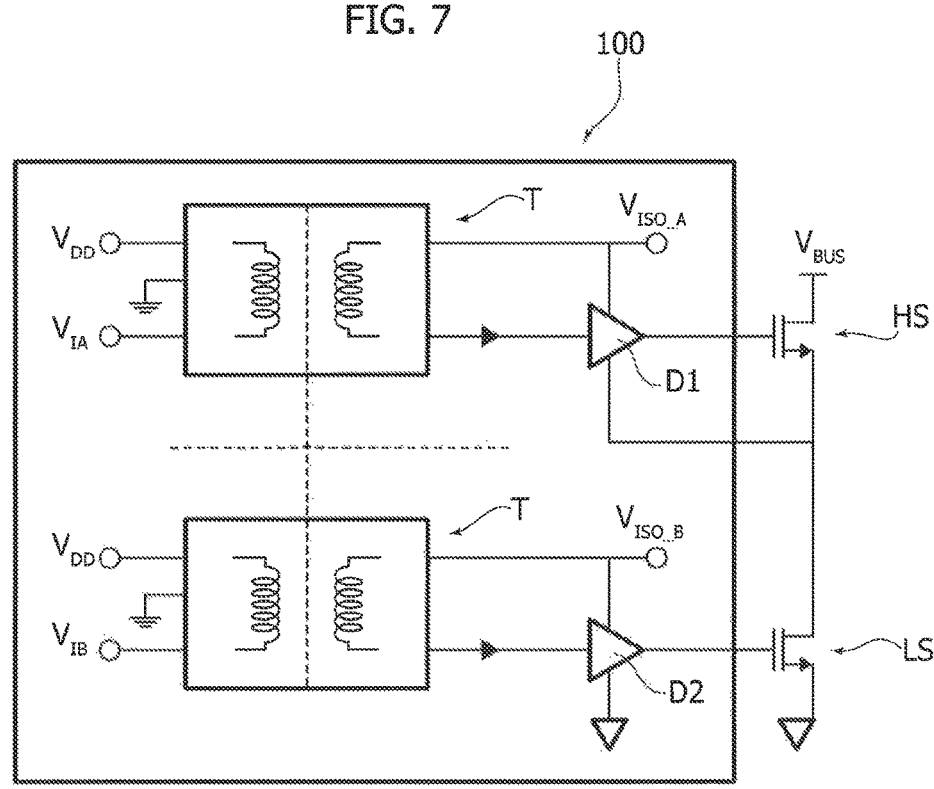
FIG. 7 is a block diagram exemplary of embodiments.

FIG. 7 is exemplary of the possibility of applying one or more embodiments (e.g. as exemplified in FIG. 2) in a fully-isolated half-bridge gate driver 100 including (only) two transformers T to provide an isolated data ($V_{IA}$, $V_{IB}$) and power ($V_{DD}$) link to two drivers D1 and D2 for high-side HS and low-side LS (e.g. power) switches. One or more embodiments may thus avoid the use of three separate transformers (one for the power link and two for data links), while achieving isolation between low-side and high-side circuits ($V_{ISO\_A}$ and $V_{ISO\_B}$).

Without prejudice to the underlying principles, the details and embodiments may vary, even significantly, with respect to what has been described by way of example only without departing from the extent of protection.

The extent of protection is defined by the annexed claims.

The invention claimed is:

1. A method of transmitting power and data via a transformer including a primary side and a secondary side, wherein a primary side signal at the primary side of the transformer generates a secondary side signal at the secondary side of the transformer, the method including:
producing the primary side signal at the primary side of the transformer by coupling a first oscillator signal modulated with a data signal for transmission to the secondary side of the transformer with a second oscillator signal selectively switched on and off to control power supply transmission to the secondary side of the transformer, wherein the first oscillation signal is applied to the primary side of the transformer both when the second oscillator signal is switched on and when the second oscillator signal is switched off, and
with respect to the secondary side signal generated at the secondary side of the transformer performing:
i) demodulation to recover at the secondary side of the transformer said data signal modulating said first oscillator signal, and
ii) rectification to recover at the secondary side of the transformer a power supply controlled by said switching on and off said second oscillator.

2. The method of claim 1, including:
coupling to the secondary side of the transformer a further data signal for transmission to the primary side of the transformer, and
applying demodulation at the primary side of the transformer to recover at the primary side of the transformer said further data signal.

3. The method of claim 2, further including discontinuing modulating said first oscillator signal with said data signal while said further data signal is coupled to the secondary side of the transformer.

4. The method of claim 2, wherein coupling to the secondary side winding is performed by superposition to said rectification.

5. The method of claim 2, wherein applying demodulation at the primary side is performed with respect to said first oscillator signal.

6. The method of claim 1, wherein a power of said second oscillator signal is higher than a power of said first oscillator signal.

7. The method of claim 1, wherein coupling said first oscillator signal and coupling said second oscillator signal includes feeding said first oscillator signal and said second oscillator signal to at least one respective winding of a stacked winding at the primary side of said transformer.

8. The method of claim 1, further including synchronizing data signals transmitted via said transformer with said selectively switching on and off said second oscillator signal for controlling power supply transmission to the secondary side of the transformer.

9. A system for transmitting power and data via a transformer including a primary side and a secondary side, wherein a primary side signal at the primary side of the transformer generates a secondary side signal at the secondary side of the transformer, the system including:

mutually coupled first and second oscillators at the primary side of the transformer, wherein the first oscillator is connected to a first winding of the primary side, said first winding having a center tap connected to receive a power supply voltage, and wherein the second oscillator is connected to a second winding of the primary side, said second winding having a center tap connected to receive said power supply voltage;

wherein the first oscillator is coupled to a modulator to produce a first oscillator signal modulated with a data signal for transmission to the secondary side of the transformer;

wherein the second oscillator is selectively switchable on and off to control power supply transmission to the secondary side of the transformer; and a demodulator and a rectifier configured to receive a secondary side signal generated at the secondary side of the transformer;

wherein the demodulator is configured to recover at the secondary side of the transformer said data signal modulating said first oscillator signal; and wherein the rectifier is configured to recovering at the secondary side of the transformer a power supply controlled by said switching on and off said second oscillator.

10. The system of claim 9, further including:

a further modulator configured to couple to the secondary side of the transformer at said rectifier a further data signal for transmission to the primary side of the transformer, and a further demodulator at the primary side of the transformer configured to recover at the primary side of the transformer at said first oscillator said further data signal.

11. The system of claim 9, further including coupling said modulator to said first oscillator at the primary side of the transformer by setting the modulator between said first oscillator and ground.

12. The system of claim 9, wherein said transformer includes a stacked primary side winding including respective pairs of windings driven by said first oscillator and said second oscillator to provide mutual coupling therebetween.

13. A circuit, comprising:

a gate driver configured to drive a gate of a transistor; and a galvanic input-output isolation circuit coupled to an input of the gate driver, said galvanic input-output isolation circuit comprising:

a transformer including a primary side and a secondary side;

mutually coupled first and second oscillators at the primary side of the transformer, wherein the first oscillator is connected to a first winding of the primary side, said first winding having a center tap connected to receive a power supply voltage, and wherein the second oscillator is connected to a second winding of the primary side, said second winding having a center tap connected to receive said power supply voltage;

wherein the first oscillator is coupled to a modulator to produce a first oscillator signal modulated with a data signal for transmission to the secondary side of the transformer;

wherein the second oscillator is selectively switchable on and off to control power supply transmission to the secondary side of the transformer;

a demodulator configured to receive a secondary side signal generated at the secondary side of the transformer and recover at the secondary side of the transformer said data signal modulating said first oscillator signal for application to the input of the gate driver; and a rectifier configured to receive the secondary side signal generated at the secondary side of the transformer and recover at the secondary side of the transformer a power supply signal controlled by said switching on and off said second oscillator for application to a power supply input of the gate driver.

14. The circuit of claim 13, wherein said transformer includes a stacked primary side winding including respective pairs of windings driven by said first oscillator and said second oscillator to provide mutual coupling therebetween.

* * * * *